United States Patent
March et al.

(10) Patent No.: US 6,693,289 B1
(45) Date of Patent: Feb. 17, 2004

(54) OPERATIONALLY POSITIONABLE SOURCE MAGNET FIELD

(75) Inventors: Marvin G. March, Lincoln, CA (US); Stephen W. Toy, Auburn, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

(21) Appl. No.: 09/499,435

(22) Filed: Feb. 7, 2000

(51) Int. Cl.[7] .................................................. H01J 37/08
(52) U.S. Cl. ................................. 250/492.2; 250/492.21
(58) Field of Search ............................. 250/492.21, 424, 250/426, 492.3

(56) References Cited

U.S. PATENT DOCUMENTS

| | | | |
|---|---|---|---|
| 3,845,312 A | 10/1974 | Allison, Jr. ................ 250/398 |
| 4,578,589 A | 3/1986 | Aitken .................... 250/492.2 |
| 4,743,767 A | 5/1988 | Plumb et al. ............. 250/492.2 |
| 4,743,806 A | 5/1988 | Gyulai et al. ............ 315/111.81 |
| 4,754,200 A | 6/1988 | Plumb et al. ............ 315/111.81 |
| 4,757,208 A | 7/1988 | McKenna et al. ........ 250/492.2 |
| 4,847,504 A | 7/1989 | Aitken .................... 250/492.2 |
| 5,130,552 A | 7/1992 | Bright et al. ............ 250/492.2 |
| 5,300,785 A | 4/1994 | Aitken .................... 250/492.2 |
| 5,306,921 A | 4/1994 | Tanaka et al. ........... 250/492.2 |
| 5,389,793 A | 2/1995 | Aitken et al. ............ 250/492.2 |
| 5,675,152 A | 10/1997 | Wong ....................... 250/427 |
| 5,886,355 A | 3/1999 | Bright et al. ........... 250/492.21 |
| 5,914,494 A | * 6/1999 | Abbott ................... 250/492.21 |
| 5,973,329 A | * 10/1999 | Kim ......................... 250/427 |
| 6,222,196 B1 | * 4/2001 | Mack .................... 250/492.21 |

OTHER PUBLICATIONS

S. Wolf and R.N. Tauber; *Silicon Processing for the VLSI Era*; vol. 1–Process Technology; 1986; 308–317. (Copy Enclosed).

* cited by examiner

*Primary Examiner*—John R. Lee
*Assistant Examiner*—Anthony Quash
(74) *Attorney, Agent, or Firm*—Campbell Stephenson Ascolese LLP

(57) ABSTRACT

A source magnet assembly for an ion source system of an ion implantation system. The source magnet assembly includes source magnetic poles that are operationally movable with respect to an arc chamber of the ion source system. In one example, the magnetic field produced by the source magnet is positionable in a two dimensional area. In another example, the magnetic field can be rotated. Some source magnet assemblies include plates that are slidable with respect to one another. The magnetic core is moved by moving the plates with respect to each other by a motorized force. With some assemblies, structures of the assembly are rotatable with respect to one another so that the core may be rotated around the arc chamber.

6 Claims, 8 Drawing Sheets

OPERATIONALLY POSITIONABLE SOURCE MAGNET FIELD

BACKGROUND OF THE INVENTION

1. Field of the Invention

This invention relates in general to ion implantation and in particular to an operationally positional source magnetic field for an ion implantation system.

2. Description of the Related Art

Ion implantation systems are utilized for implanting ions in a substance. For example, ion implantation systems can be used to implant impurity ions in a semiconductor substrate of a wafer to form doped regions.

FIG. 1 is a diagram of an example of an ion implantation system for implanting ions into a target semiconductor wafer. Ion implantation system 101 includes an ion source system 105, an analyzing magnet 107, resolving aperture 109, and an acceleration tube 111. Ion implantation system 101 also includes a scanning system to distribute ions uniformly over a target wafer 131. In FIG. 1, the scanning system includes focus lens 112, neutral beam trap and beam gate 108, Y axis scanner 113, beam trap and gate plate 115, and X-axis scanner 119. Ion implantation system 101 also includes a system end station 132. End station 132 includes an area defining aperture 135, a Faraday cup and current integrator (which directly measures the implant dose by collecting the beam current and integrating over the implant time), and a subsystem that loads, holds, and positions the target wafer 131 for ion implementation. The Faraday cup nearly surrounds target wafer 131 and has an opening around aperture 135. Ion implantation system 101 also includes a vacuum system 133 for evacuating various chambers and components of the ion system. Ion implantation system 101 further includes a system controller 143 for controlling the operation of the ion implantation system. A further description of an example of an ion implantation system can be found in the *Silicon Processing for the VLSI Era*, by S. Wolf and R. N. Tauber, Vol. 1, 1986, pages 308–317. Other examples of ion implantation systems can be found in Plumb et al, U.S. Pat. No. 4,743,767; Aitken U.S. Pat. No. 5,300,785; Tanaka et al., U.S. Pat. No. 5,306,921; Mekenna et al., U.S. Pat. No. 4,757,208; Aitken et al., U.S. Pat. No. 5,389,793; Wong, U.S. Pat. No. 5,675,152; all of which are incorporated by reference in their entirety.

FIG. 2 is an illustrative diagram of an example of an ion source system of an ion implantation system. Ion source system 201 is a Bernas type ion source system. Located within arc chamber 203 is pig tail type filament 205 and repeller plate 207. A current provided through filament 205 generates thermal electrons which are accelerated through a gas species to collide with atoms of the gas species to produce ions. The gas species material is provided from a feed source (not shown) via the gas feed inlet 211. Ions exit the chamber through extraction slit 227.

The ion source system shown includes two source magnet poles that generate a magnetic field (designated as the dashed arrows) in arc chamber 203. The magnetic field alters the electron paths (e.g., path 222) to increase the probability of collisions with source material gas species atoms, thereby producing more ions. Source magnet poles for conventional ion implantation systems are operationally fixed with respect to the arc chamber such that they are capable of providing a magnetic field in only one position with respect to the arc chamber. Some ion implantation systems include the ability to vary the magnetic field provided by the source magnet poles 217 and 219. Varying the magnetic field allows the field strength to be set to a value that provides the maximum ion output for the source magnet core poles as positioned.

Because the magnetic field generated by a source magnet affects the ionization in the arc chamber, the magnetic field may create "hot spots" of ion plasma in the arc chamber which can shorten the life of the filament in the chamber.

SUMMARY OF THE INVENTION

It has been discovered that providing an ion implantation system with source magnetic structures that are operationally positionable with respect to an arc chamber advantageously provides the ion implantation system with the ability to move a magnetic field to maximize ion generation efficiency. Moving a magnetic field with respect to the arc chamber may also allow potential hot spots in the ion chamber to be moved within the chamber, thereby extending the operating life of the filament.

In one aspect of the invention, a method for generating ions includes generating ions from an arc chamber with source magnet poles providing a magnetic field in a first position with respect to the arc chamber. The method also includes positioning the source magnet poles to provide a magnetic field in a second position. The second position is different from the first position. The method further includes generating ions from the arc chamber with the magnetic field in the second position.

In another aspect, the invention includes an ion source system for an ion implantation system. The ion source system includes an arc chamber and a source magnet assembly including at least two magnetic poles that are positionable with respect to the arc chamber to provide a plurality of operational magnetic field positions with respect to the arc chamber.

In another aspect of the invention, an ion implantation system includes a ion source system including an arc chamber. The ion implantation system also includes means for providing a magnetic field for the ion source system in a plurality of operational positions with respect to the arc chamber.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
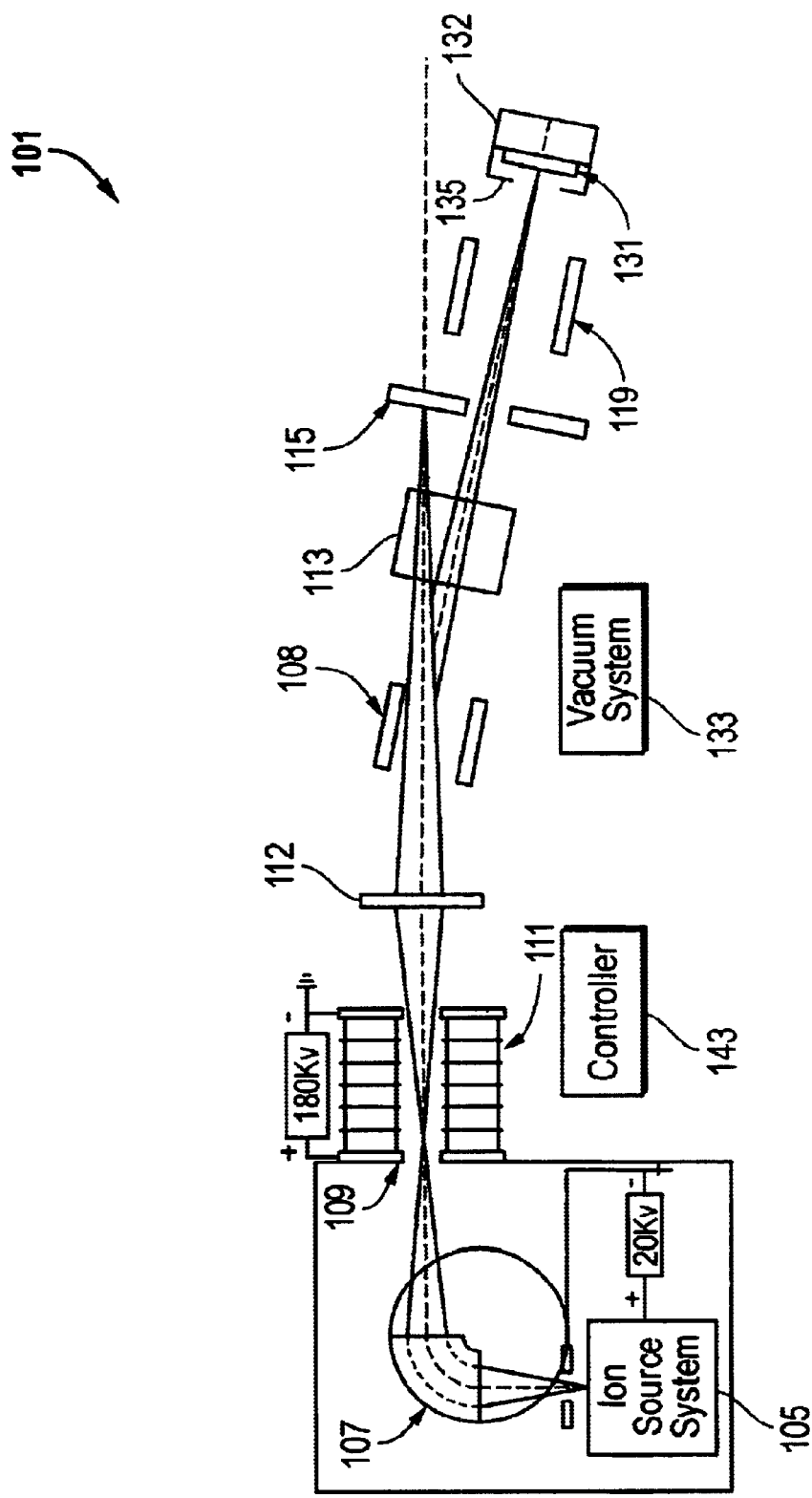
FIG. 1 is a diagram of an example of a prior art ion implantation system.
Figure 3:
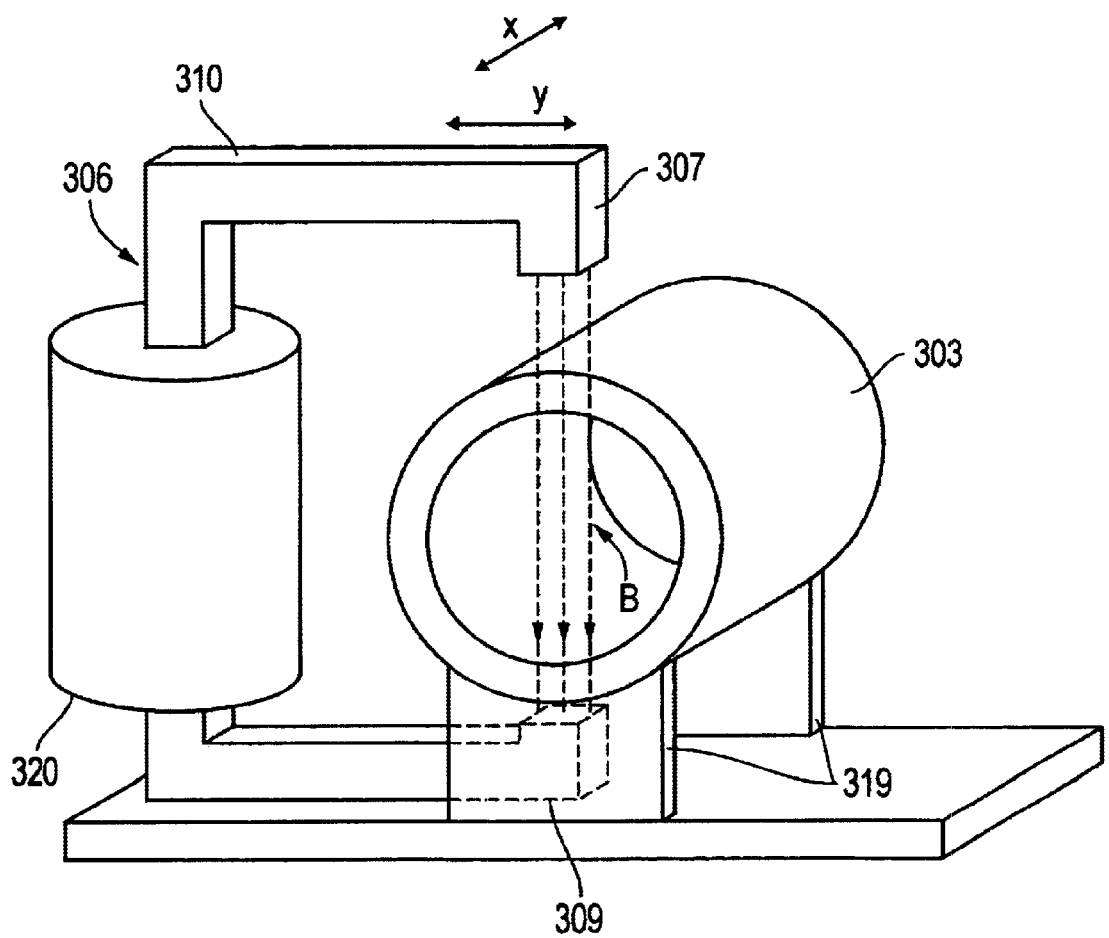
FIG. 3 is a perspective view of an example of an ion source housing and source magnet according to the present invention.

FIG. 3 is a perspective view of an example of an ion source housing and a source magnet for an ion implantation system according to the present invention. Ion source housing 303 and source magnet 306 are implemented in an ion implantation system (the remaining portion not shown in FIG. 3) such as, e.g., an ion implantation system similar to that shown in FIG. 1, described the incorporated patents listed in the background section, or other conventional ion implantation systems. In one embodiment, ion source housing 303 houses components for a Bernas type ion source system such as an arc chamber (e.g., 203), a filament (e.g., 205), and a repeller plate (e.g., 207) (none shown in FIG. 3). Ion source housing 303 may also house other components of the ion source system including thermocouples, heat shields, corona shields, and gas lines (none shown in FIG. 3). In other embodiments, other types of ion source systems may be housed in ion source housing such as, e.g., a Freeman type ion source system that includes a straight filament, an Indirectly Heated Cathode (IHC) ion source system that includes a target plug in the arc chamber, a cold cathode discharge ion source system that utilizes a high voltage discharge to produce electrons, and an RF microwave ion source system.

Ion source magnet 306 generates a magnetic field (shown as dashed lines and labeled "B") at the opening of its C shaped magnetic core 310. This magnetic field alters the electron paths in the arc chamber (not shown in FIG. 3) of ion source housing 303 to increase the probability of collisions with source material gas species atoms, thereby producing more ions. Source magnet 306 includes a power winding portion 320 that has wire windings (not shown) wrapped around core 310 that are energized to produce a magnetic field between end core structures 307 and 309. End core structures 307 and 309 are located above and below ion source housing 303 and act as magnetic poles of opposite polarity to provide a magnetic field in the arc chamber located in ion source housing 303. End core structure 309, shown in phantom in FIG. 3, is located between housing supports 319.

Source magnet 306 is operationally positionable with respect to the arc chamber of the ion source housing 303 in both a direction parallel with the X axis shown and a direction parallel with the Y axis shown. Thus, the orientation of the magnetic field produced between end core structures 307 and 309 is operationally positionable in both directions parallel to the X axis and directions parallel to the Y axis with respect to the arc chamber within ion source housing 303.

Providing a source magnetic field that is operationally positionable with respect to the arc chamber allows the magnetic field to be positioned in an operating position to provide the optimal ion output by the ion source system.

Also, providing a source magnetic field that is operationally positionable with respect to the arc chamber allows for hot spots in the chamber to be periodically moved thereby extending the life of a filament.

Figure 4:
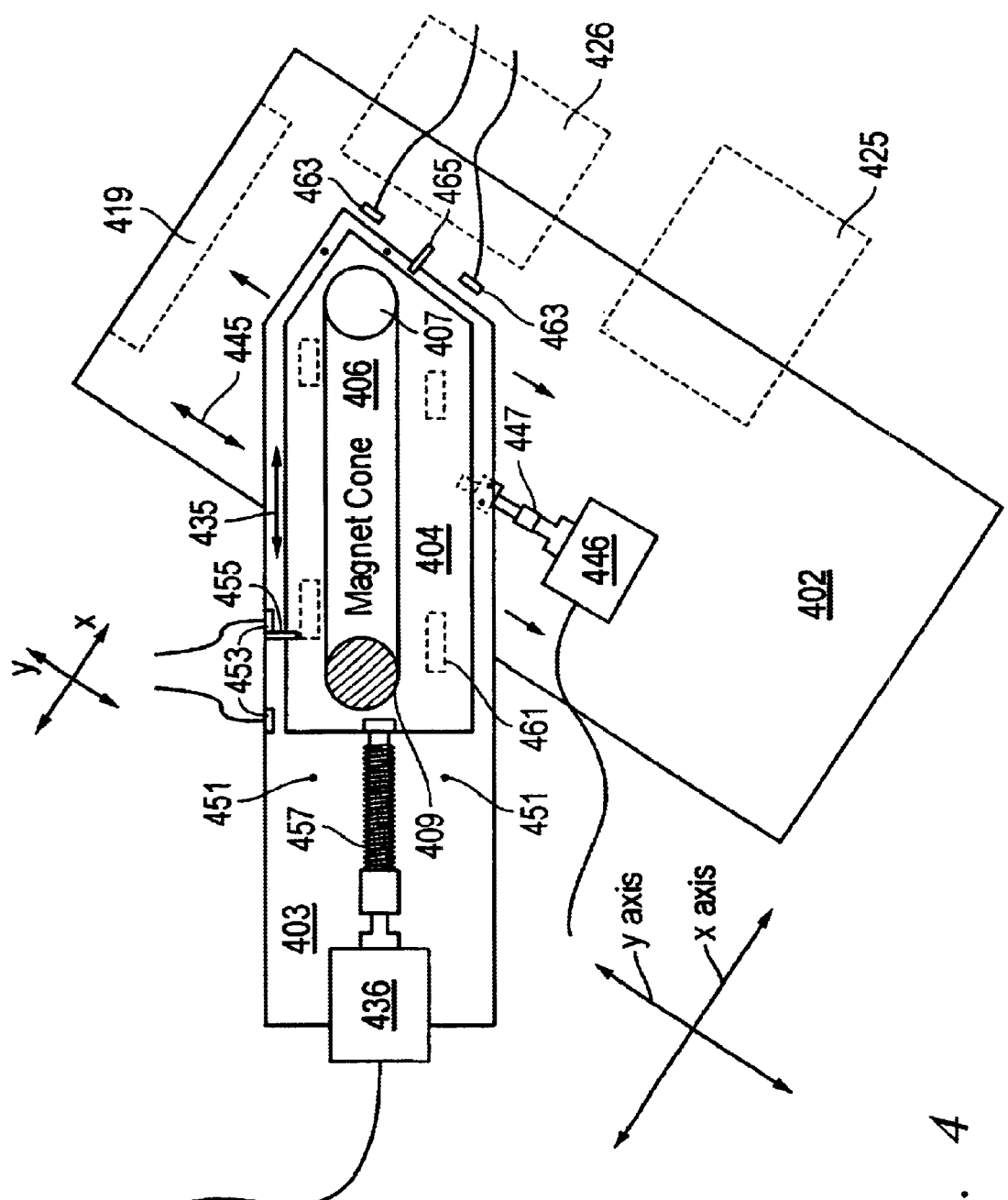
FIG. 4 is a top cutaway view of an example of a portion of a source magnet assembly according to the present invention.

FIG. 4 is a top cut away view of an source magnet assembly for providing a magnetic field that is operationally positionable with respect to an arc chamber according to the present invention. Shown in FIG. 4 is a bottom portion of a magnetic core 406 having a bottom end core structure 407 which provides a first magnetic pole. A corresponding second magnetic pole is provided by a top end core structure (not shown) that is located above bottom core structure 407. The other end 409 of magnetic core 406 shown in FIG. 4 extends up through a power winding portion (not shown).

Magnet core 406 is coupled to a top plate 404. Top plate 404 is slidably coupled to bottom plate 403 via sliding bearings 461 (shown in phantom) such that top plate 404 and bottom plate 403 are movable with respect to each other in a direction shown by arrow 435. Bottom plate 403 is slidably coupled to base 402 with sliding bearings (not shown in FIG. 4) such that bottom plate 403 and base 402 are movable with respect to each other in direction shown by arrow 445. An ion source housing (e.g., 303) including an arc chamber and filament (none shown in FIG. 4) are fixably attached to base 402 with the arc chamber being located in a position generally above end core structure 407. Shown in phantom in FIG. 4 is a footprint 419 where an ion source housing support (e.g., 319) is attached to base 402. Also shown in phantom in FIG. 4 are the locations of a tilt-drive 425 and a side-drive 426 for extraction electrode steering.

Mounted to bottom plate 403 is a DC motor 436. When activated, DC motor 436 turns threaded drive 437 to move the top plate 404 in a direction either towards or away from motor 436. Mounted to bottom plate 403 are limit switches 453 in which a switch structure 455 mounted to top plate 404 contacts to turn off motor 436 when top plate 404 has reached its operating limits with respect to bottom plate 403. Mounted to bottom plate 403 are stopping posts 451 that physically restrict the movement of top plate 404 with respect to bottom plate 403. Mounted to base 402 is a DC motor 446. When activated, DC motor 446 turns threaded drive 447 to move the base 402 in a direction either towards or away from motor 446. Mounted to base 402 are limit switches 463 in which a switch structure 465 mounted to bottom plate 403 contacts to turn off motor 446 when plate 403 has reached its operating limit with respect to base 402.

The assembly shown in FIG. 4 allows magnetic core 406 to be moved to any position within a two dimensional area as defined by the range of movement of top plate 404 with respect to bottom plate 403 and by the range of movement of bottom plate 403 with respect to base 402. Magnetic core 406 is movable to a position in the range by activating motors 436 and 446 to move top plate 404 with respect to bottom plate 403 and/or to move bottom plate 403 with respect to base 402. For example, to move magnetic core 406 in a direction parallel to the Y axis shown in FIG. 4, motor 446 is activated to either turn in a first direction to push bottom plate 403 (as well as top plate 404 and magnetic core 406) away from motor 446 or to turn in the opposite direction to pull bottom plate 403 towards motor 446. To move magnetic core 406 in a direction parallel to the X axis, both motors 436 and 446 would be activated in that bottom plate 403 is positioned at a non right angle with base 402. Thus, a movement parallel to the X axis would require the movement of top plate 404 with respect to bottom plate 403 and the movement of bottom plate 403 with respect to base 402. Positioning bottom plate 403 at a non right angle with respect to the base 402 allows for the width of the source magnet assembly to be reduced.

Figure 2:
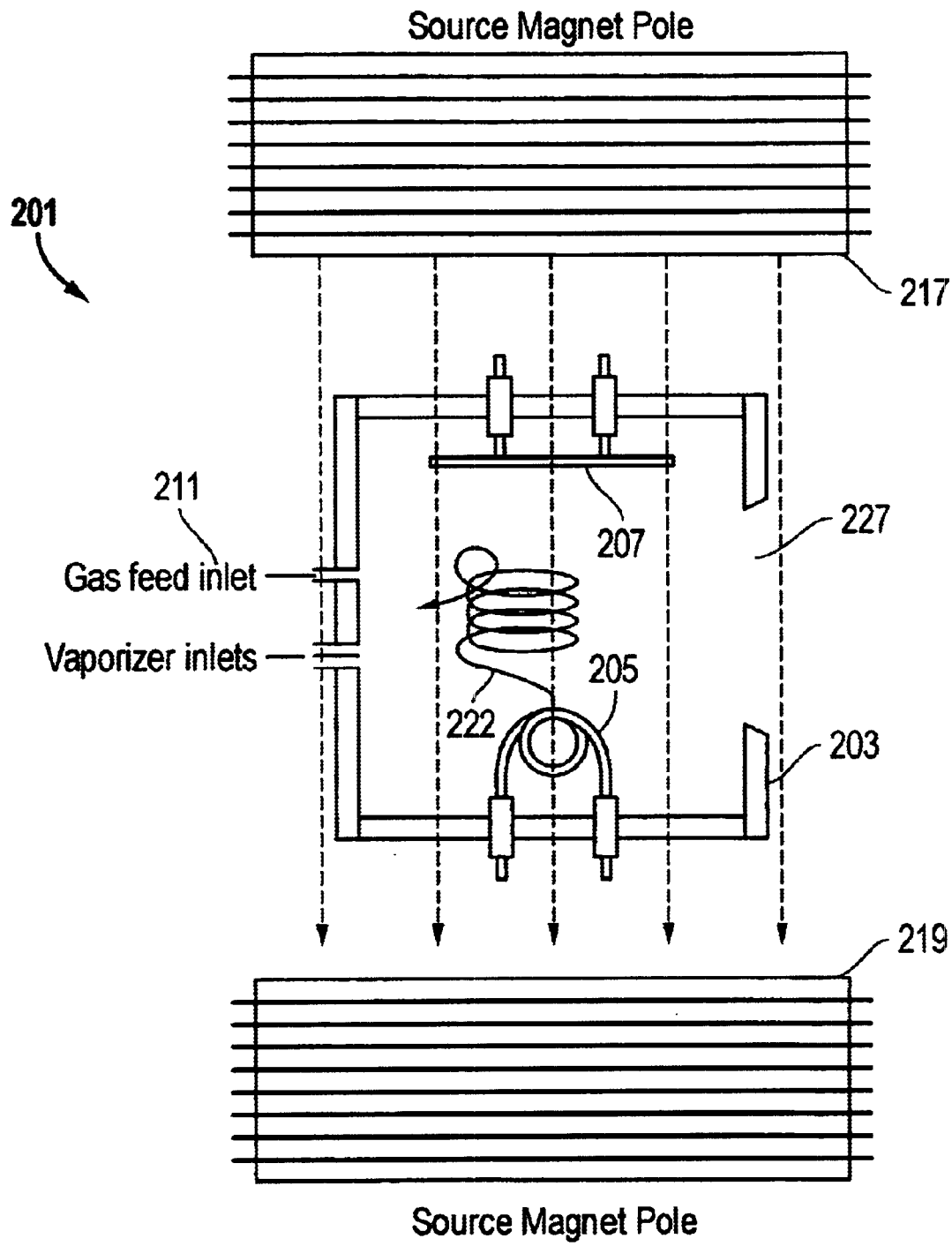
FIG. 2 is an illustrative diagram of an example of a prior art ion source system of an ion implantation system.

By moving the end core structures (407 shown) the source magnet assembly of FIG. 4 allows a magnetic field to be produced by the magnet core 406 in any position within a two dimensional area as defined by the range of movement of the end core structures (with 407 shown). Preferably, the two dimensional area of movement of the magnetic poles should be designed to at least traverse the width of the arc chamber. Referring back to FIG. 2, for an arc chamber having a horizontal width of "1" in a first dimension and a width of "1" in a second dimension, the range of motion of the magnetic poles preferably should at least traverse the 1 square inch area of the arc chamber.

In one embodiment, motors 436 and 446 and limit switches 453 and 463 are all operably coupled to an ion implantation system controller (e.g., 143) that controls the operation of the ion implantation system. The controller would also control the pressure and gas flow into the arc chamber as well as the current of the source magnet power portion (e.g., 320) to control the amount of ions generated. With some embodiments, the controller would receive indications of ions generated as measured at an end station (e.g., 132) and would adjust the intensity and position of the magnetic field to produce the desired ion implantation rate.

To move the source magnet core to a second operating position from a first operating position, the controller activates motor 436 and/or motor 446 to move core 406 in a direction towards the second position from the first position. In some systems, the controller stores the present location of magnetic core 406 and activates each motor for a required number of rotations in the appropriate direction to move the core to the desired position. Other systems include sensors located on the ion source housing to determine the location of the magnetic core 406. Still with other systems, axis drive encoder pulse devices are located on motors 436 and 446 to provide an indication of the magnetic core location. Still with other systems, the rotation signal to activate the motors is monitored to provide an indication of magnetic core location.

Figure 5:
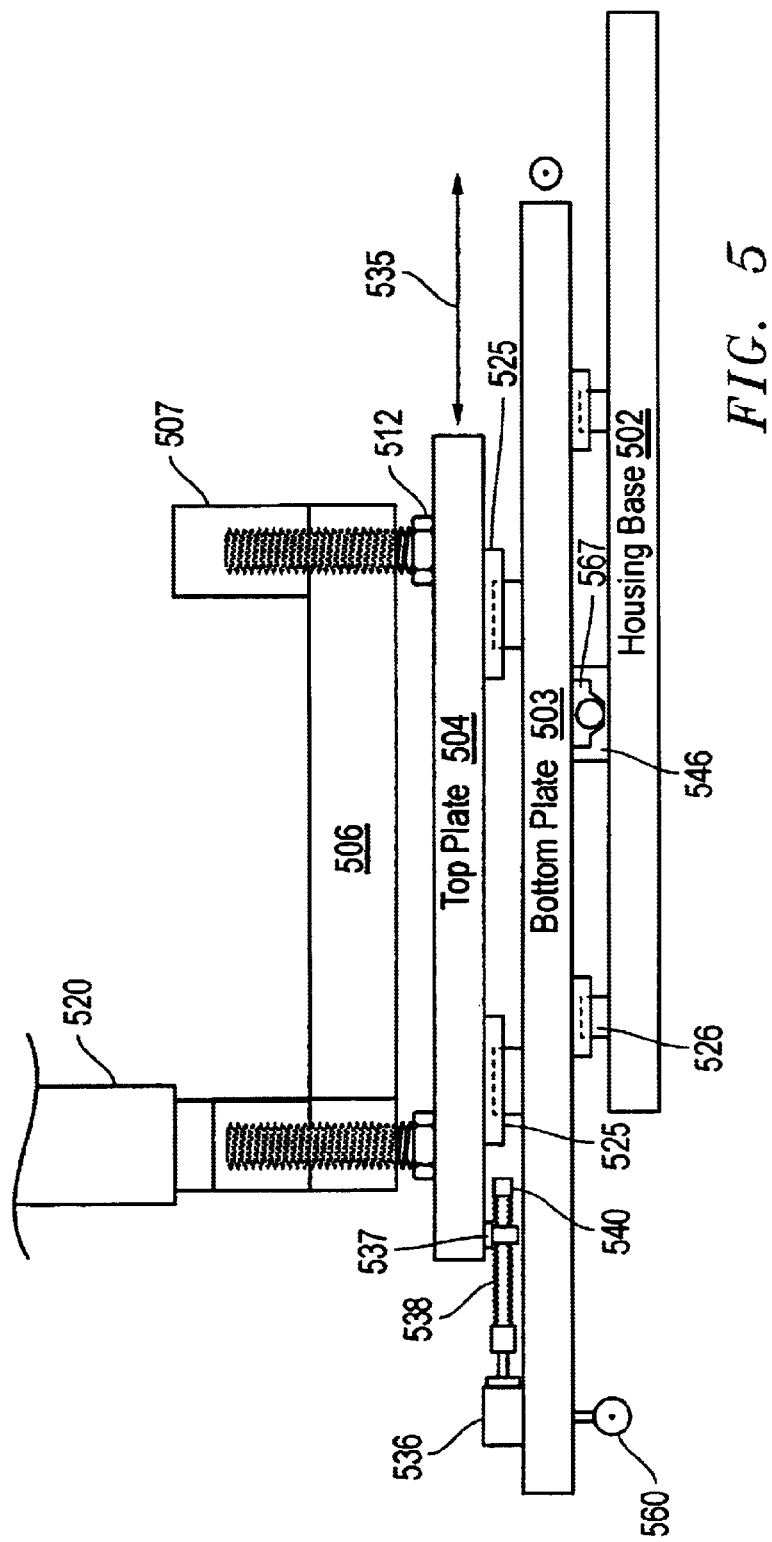
FIG. 5 is a partial side view of an example of a portion of a source magnet assembly according to the present invention.

FIG. 5 is a partial side view of a source magnet assembly for providing a magnetic field that is operationally positionable with respect to an arc chamber. Magnetic core 506 is mounted to top plate 504 via support fasteners 512. An upper core structure (not shown) is located above lower end core structure 507 with an ion source housing (not shown in FIG. 5) located generally between the upper core structure and lower core structure 507. Partially shown in FIG. 5 is power winding portion 520.

Top plate 504 is slidably coupled to bottom plate 503 via four sliding bearings (with two sliding bearings 525 shown in FIG. 5) such that top plate 504 is movable with respect to bottom plate 503 in a direction parallel to arrow 535. Bottom plate 503 is slidably coupled to base 502 via four sliding bearings (with two sliding bearings 526 shown in FIG. 5) such that bottom plate 503 is movable with respect to housing base 502 in a horizontal direction that is perpendicular to arrow 535. An example of a sliding bearing is a Linear Ball Bearing Slide sold under the Catalog No. 6203KXX by MCMASTER-CARR and a Linear Crossed-Roller Bearing Slide sold under the Catalog No. 6257KXX by MCMASTER-CARR. With other assemblies, the plates would be slidably coupled via other sliding mechanisms such as, e.g., rails.

In one embodiment, top plate 504 is moveable with respect to bottom plate 503 by approximately 2 inches and bottom plate 503 is movable with respect to base 502 by approximately 2 inches. The range of mobility may vary with other source magnet assemblies.

Figure 6:
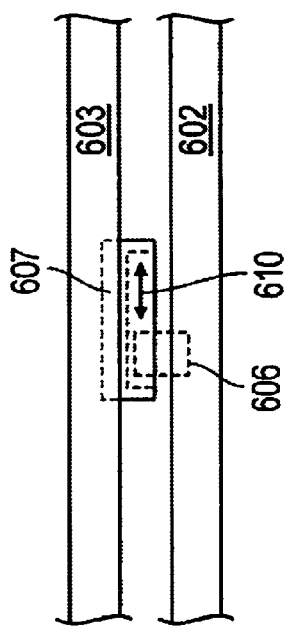
FIG. 6 is a side view of an example of a sliding bearing according to the present invention.

FIG. 6 shows a partial side view of an example of a sliding bearing according to the present invention. Inner structure 606 is counter sunk in bottom plate 602 and outer structure 607 is counter sunk in top plate 603. Inner structure 606 moves within outer structure 607 as per the direction of arrow 610 shown in FIG. 6.

Referring back to FIG. 5, motors 536 and 546 provide a moving force (when activated) for moving plates 504 and 503 and base 502 with respect to each other and for providing a holding force (when not activated) to hold plates 504 and 503 and base 502 in a fixed position with respect to each other. Threaded bracket 537 is attached to the under side of top plate 504 and receives threaded drive 538. Attached to bottom plate 503 is bracket 540 with a bearing that receives an end of threaded drive 538 to provide support for threaded drive 538. A rotation of threaded drive 538 provides a force on threaded bracket 537 to move top plate 504 with respect to bottom plate 503. Threaded bracket 547 is attached to the under side of bottom plate 503 and receives a threaded drive from motor 546. The rotation of the threaded drive by motor 546 provides a force on threaded bracket 547 to move bottom plate 503 with respect to base 502. Wheel 560 is attached to the underside of bottom plate 503 to provide support to the left end of bottom plate 503, relative to the view shown in FIG. 5.

Figure 7:
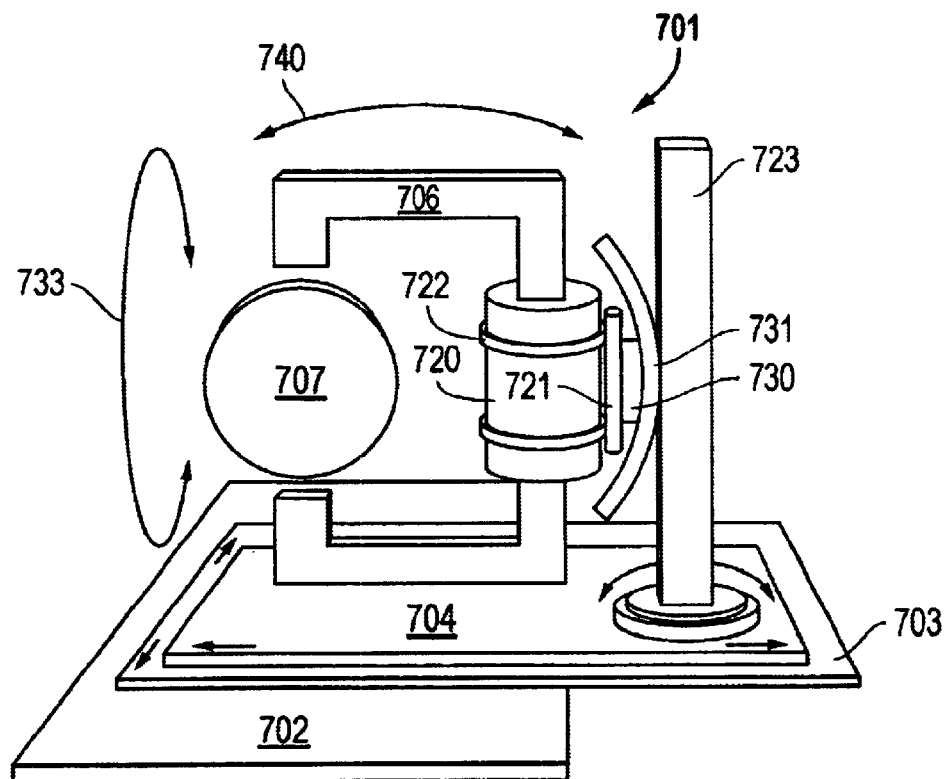
FIG. 7 is a perspective view of an example of a source magnet assembly according to the present invention.

FIG. 7 is a perspective view of a source magnet assembly which allows for the operational rotation of the magnetic poles. Source magnet assembly 701 includes magnetic core 706 supported from pole 723 that is rotatably mounted to top plate 704 such that magnetic core 706 is rotatable around pole 723. Top plate 704 is slidable with respect to bottom plate 703 in a first horizontal direction, and bottom plate 703 is slidable with respect to base 702 in a second horizontal direction perpendicular to the first horizontal direction.

Power source portion 720 is secured to plate 721 via straps 722. Plate 721 is rotatably coupled to intermediate bracket 730 such that core 706 is rotatable with respect to ion source housing 707 in the direction shown by arrow 733. Intermediate bracket 730 includes an arch portion (not shown) that resides in and is slidable with respect to arch rail 731 such that core 706 is rotatable with respect to ion source housing 707 in the direction of arrow 740. Arch rail 731 is fixably coupled to pole 723.

Source magnet assembly 701 includes a rotary actuator (not shown) for providing a rotational force to rotate plate 721 with respect to intermediate bracket 730 and a rotary actuator for providing a rotational force to rotate pole 723 with respect to top plate 704. The rotary actuator may be electronically activated or pneumatically activated. Source magnet assembly 701 also includes a cylinder or other force providing mechanisms (not shown) for moving intermediate bracket 730 with respect to arch rail 724. Also, not shown in FIG. 7 are force providing mechanisms (e.g., motors or actuators) for providing a force to move plates 704 and 703 and base 702 with respect to one another.

In one embodiment, core 706 is moveable by 30 degrees in the direction of arrow 740 and by 180 degrees in the direction of arrow 733. Core 706 is rotatable around pole 723 by 30 degrees. With other source magnet assemblies, the ranges of rotation of the magnetic core may vary. In addition some source magnet assemblies have the capability to reverse the magnetic field provided between its magnetic poles. Consequently, a magnetic field provided by a source magnetic core that is rotatable by 180 can be effectively rotated by 360 degrees.

Figure 8:
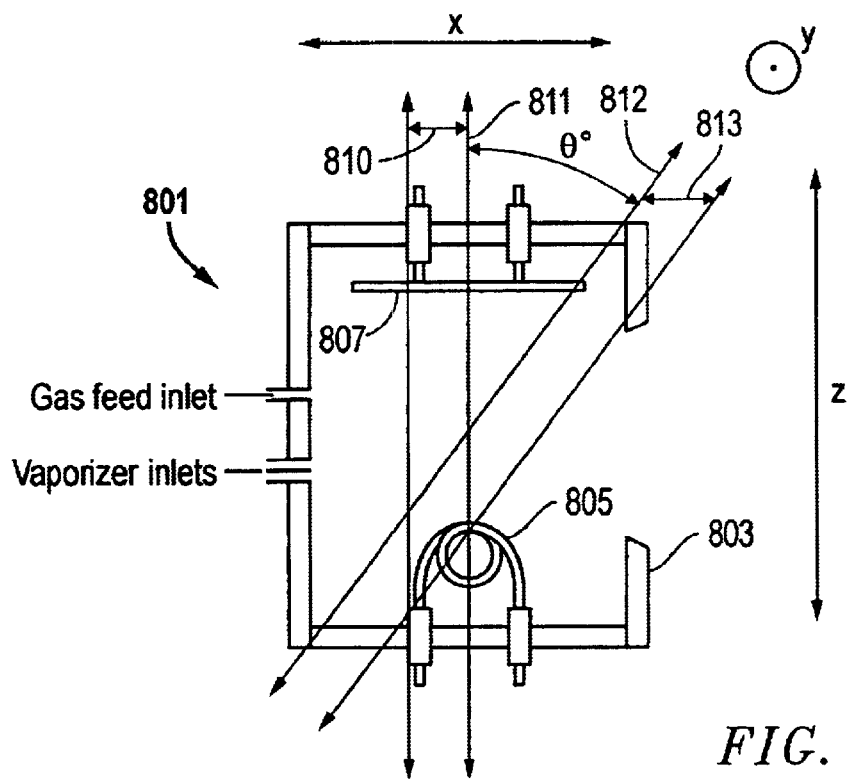
FIG. 8 is an illustrative view of an arc chamber showing examples of various operating positions of source magnetic fields according to the present invention.

FIG. 8 is an illustrative view of an arc chamber showing examples of various operating source magnetic field positions according to the present invention. Ion source system 801 includes arc chamber 803, filament 805, and repeller plate 807. Arrows 810, 811, 812, and 813 each represent the center of a magnetic field position that may be provided by a source magnet assembly (not shown in FIG. 8) according to the present invention. In FIG. 8, the X axis is shown in a horizontal orientation, the Y axis is shown in a horizontal orientation going into the page, and the Z axis is shown in a vertical orientation.

Arrow 811 also represents the shortest distance between repeller plate 807 and the center of filament 805. Prior art Bernas type ion source systems typically provide a magnetic field having the position of arrow 811. A source magnet assembly that can provide a magnetic field that is movable in only two dimensions (e.g., the source magnet assemblies of FIGS. 4 and 5) is preferably configured to provide the magnetic field in operating positions that are parallel (in both the X and Y directions) to arrow 811 (e.g., source magnetic field 811).

Arrow 812 represents a magnetic field position that is rotated from magnetic field position 811 by an angle of θ. Such a magnetic filed position can be provided by a source magnet assembly that has end core structures that are rotatable with respect to the arc chamber (e.g., the source magnet assembly of FIG. 7). Magnetic field position 813 represents a magnetic field that is shifted to the right, relative to the view shown in FIG. 8, along the X axis from magnetic field position 812.

A source magnet assembly that can provide multiple magnetic field positions with respect to an arc chamber allows a user to evaluate the ion output at various positions to determine the magnetic field position of optimum ion efficiency. Such a determination may be made prior to the implantation of ions into a target wafer and/or periodically during the operation of the ion implantation system.

Figure 9:
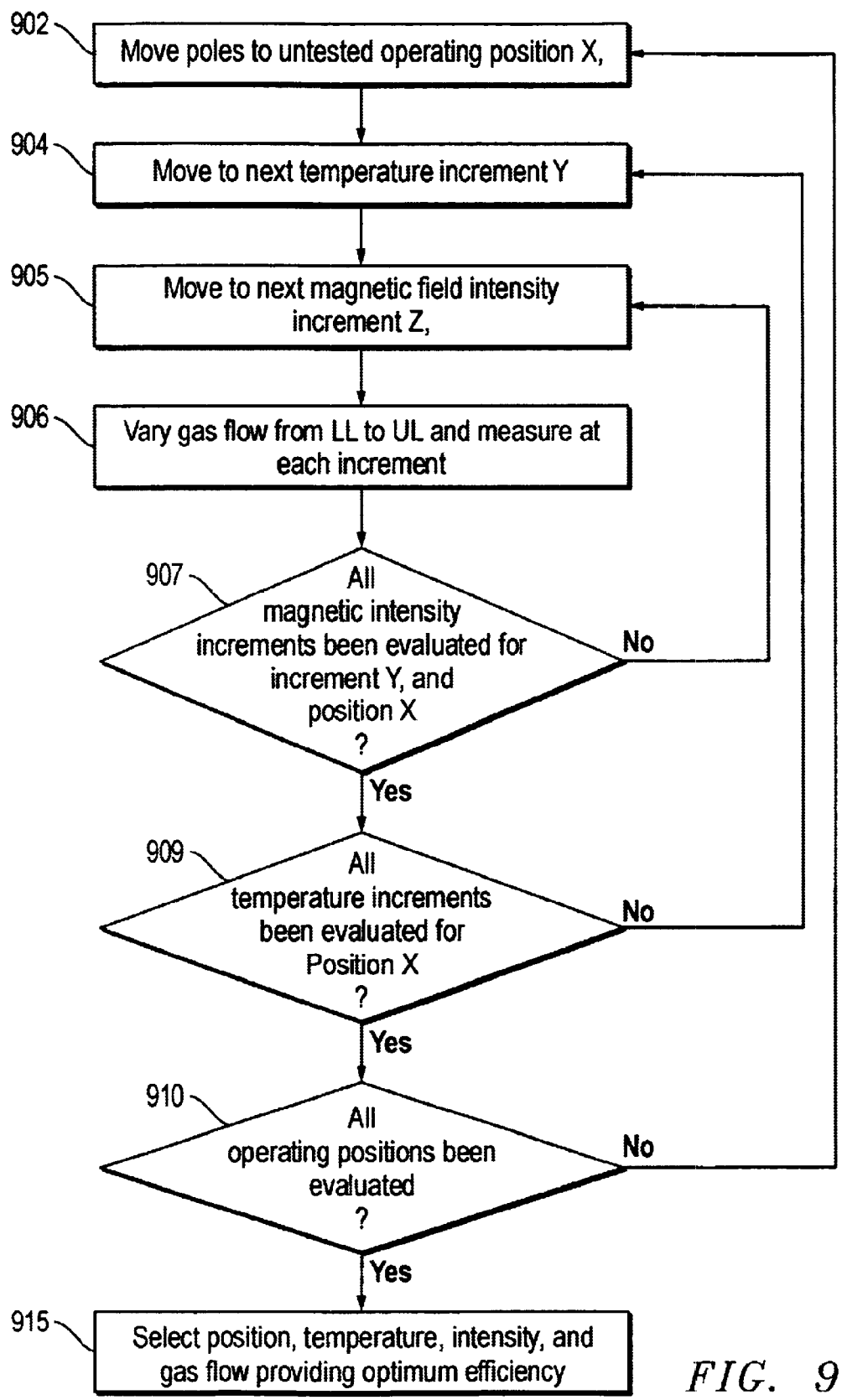
FIG. 9 is a diagram of an example of a procedure for determining a magnetic pole position that provides a maximum ion output.

FIG. 9 is a flow chart of an example of a procedure for determining a source magnetic pole position to provide an optimum ion output. The procedure shown in FIG. 9 evaluates the ion efficiency for each operating position with respect to three other operating variables, the operating temperature of the filament, the source magnetic field intensity, and the gas flow rate of the source material gas into the arc chamber. Each operating position X represents a particular operating position of the poles within the range of operating positions provided by a source magnet assembly. For example, referring to the source magnet assembly of FIG. 5, if core 507 is movable within a two inch range of the X axis and a two inch range of the Y axis, then the magnetic field is positionable within a four square inch area. In one example, twenty five ion efficiency measurements can be made in the four square inch area at half inch increments. For source magnet assemblies having rotatable magnetic poles, additional positions could be evaluated by rotating the field at each position. In some systems, source ion output is measured in terms of ion beam current delivered to a target at an end station (e.g., 132).

In 902, the magnetic poles are moved to an untested position. In 904, the filament is set at a first operating temperature increment Y. In 905, the magnetic field intensity is set to a first increment Z. In 906, the gas flow is varied incrementally from the lower limit (LL) to the highest limit (UL) and with the ion output being measured at each increment. In 907, a determination is made whether all of the magnetic field intensities for temperature increment Y and position X have been evaluated. If not, in 905, the magnetic field intensity Z is set to the next increment and step 906 is performed. When all of the magnetic field intensity increments have been evaluated as determined in 907, a determination is made if all of the temperature increments have been evaluated for operating position X in 909. If not, then in 904, the temperature is then set to the next increment Y, where operations 905 and 906 and determinations 907 and 909 are performed until a determination is made that all temperature increments for position X have been evaluated. Afterwards, in 902, the poles are moved to the next operating position X where operations 904, 905, 906 and determinations 907, 909, and 910 are performed until a determination is made that all source magnet pole positions have been evaluated. In 915, a source magnet position, filament temperature, source magnetic field intensity, and gas flow increment are selected that provides the optimum ion output.

In some systems, filament temperature is a function of filament electrical current and the source magnetic field intensity is a function of electrical current through the windings of the power winding portion (e.g., 320). Accordingly, with these systems the filament electrical current and power winding electrical current are set at increments to provide a corresponding filament temperature increment and magnetic filed intensity increment, respectively. In one example, for the production of 1.0 mA of ion beam current, the flow rates for the gas $PH_3$ range from 0.5 sccm to 2.0 sccm with increments of 0.1 sccm, the source magnet power winding electrical current ranges from 0.5 A to 4.0 A with increments of 0.1 A, the filament electrical current ranges from 60 A to 200 A with increments of 1 A, and the magnetic poles are positionable within a two dimensional range of 1 square inch with increments of 1/32 inch. Under these conditions with an NH20 type ion implantation system by NISSIN, a maximum ion beam current of 1.0 mA can be obtained.

The operations of FIG. 9 are implemented in a computer program executed by a ion system controller (not shown) that has control over the source magnet pole position, the filament temperature, the source magnetic field intensity, and the gas flow as well as input for measuring ion output. However, with other systems, some of the operations may be performed manually. With some systems, the variable ranges that each position is tested may be dependent upon the type of ions to be produced and/or the source gas material.

The procedure set forth in FIG. 9 measures the ion source output for each position at each increment of source magnetic field intensity, gas flow rate, and filament temperature. With some systems, the operations set forth in FIG. 9 may be performed in a different order. For example, operation 906 may be performed in the position of operation 905 and operation 905 may be performed in the position of operation 906. Preferably, the variable (position, temperature, intensity, or flow rate) which is the easiest to increment would be performed at the inner loop position (the position of operation 906 in FIG. 9). Other systems may include test efficiency routines that skip portions of a test when the trend in the ion output is decreasing. For example, if in 906, the ion output is decreasing for each increase in gas flow, then the ion system controller would move to the next magnetic field intensity increment in 905, without measuring the remaining gas flow increments.

Figure 10:
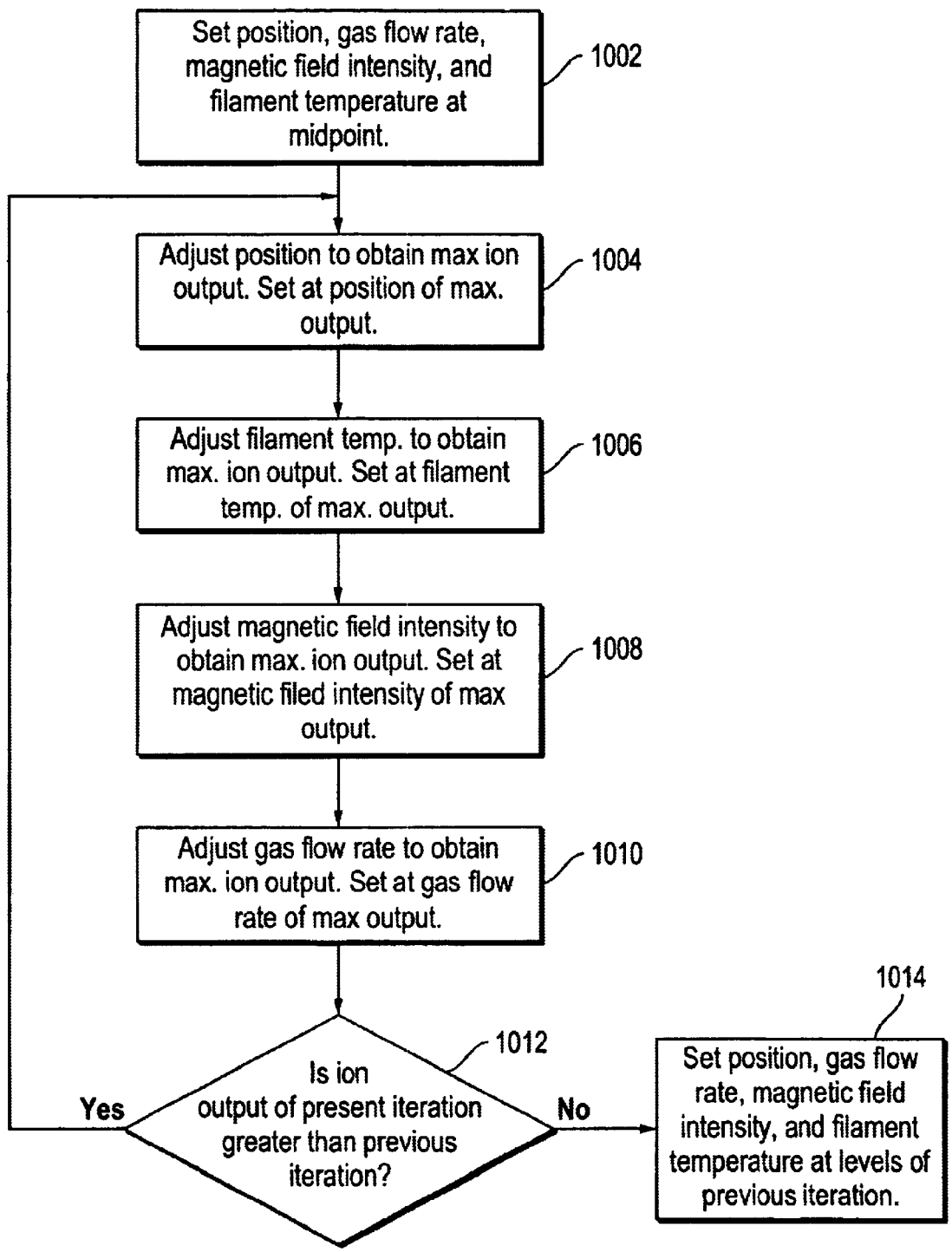
FIG. 10 is a diagram of another example of a procedure for determining a magnetic pole position that provides a maximum ion output.

FIG. 10 sets forth another example of a procedure for determining a source magnetic pole position to provide an optimum ion output. In 1002, each variable (magnet pole position, filament temperature, magnetic field intensity, and gas flow rate) are set at mid point values of their possible ranges. In 1004, the position of the magnetic poles are adjusted to find a pole position that provides the maximum ion output. The source magnet assembly then sets the magnet poles at the position of maximum ion output. In 1006, the filament temperature is adjusted to find a temperature that provides the maximum ion output. The filament temperature is set at the temperature that provides the maximum ion output. In 1008, the magnetic field intensity is adjusted to find the field intensity that provides the maximum ion output. The magnetic filed intensity is then set at the value that provided the maximum ion output. In 1010, the gas flow rate is adjusted to find the flow rate that provides the maximum ion output. The gas rate is then set at the value that provided the maximum ion output.

If in 1012, the measured ion output is greater than the measured ion output of the previous iteration through operations 1004, 1006, 1008, and 1010, then operations 1004, 1006, 1008, and 1010 are repeated in another iteration. If the ion output is not greater than the ion output for the previous iteration, the position, gas flow rate, magnetic field intensity, and filament temperature level are set at their values that provided the maximum ion intensity during the previous iteration. The procedure of FIG. 10 continues to perform iterations of the operations of FIG. 10 as long as the ion output continues to improve with each iteration.

Other systems may utilize different procedures for determining an optimum ion output. In other systems, other operating conditions may be adjusted to determine an optimum ion output. With other systems, a lesser number of conditions, (e.g., magnetic pole position and filament temperature) would be varied to determined optimum ion output. With other types of ion source systems, different variables may be adjusted in the determination of an optimum ion output. For example, with a cold cathode type system, the discharge voltage level may be adjusted to determine a maximum ion output.

In some systems, the ion implantation system controller would be programmed to periodically vary the position of the source magnetic field within a particular range so as to move the hot spots in the arc chamber. Referring back to FIG. 8, a magnetic source assembly may periodically move (e.g., every 15 minutes) the source magnetic field to a position surrounding position 811 to move the hotspot in arc chamber 803. In other embodiments, the magnetic field would be moved 1/32 inch every 15 minutes. By moving the hotspot in the chamber around periodically, the operating life of the filament may be extended.

With some systems, the source magnet assembly may continuously move the source magnetic filed during the operation of the ion implantation system. With other systems, the movement may occur at periodic intervals during the operation.

With some systems, the ion implantation system may operate according to a program that positions the poles at predetermined positions prior to the operation of the system and/or during the operation of the system. In these embodiments, the operating position selected may depend upon other factors such as the type of ions to be implanted and the source gas material.

Those of skill in the art will recognize that, based upon the teachings herein, several modifications may be made to the embodiments shown in FIGS. 1–10. For example, a source magnet assembly may be implemented in other types of ion implantation systems and/or for other types of ion source systems. Source magnet assemblies may have other structural configurations for providing source magnetic poles that are operationally movable with respect to the arc chamber. For example, the magnetic core maybe mounted to an arm including multiple pivot points to allow the arm to be positionable in multiple positions. Also, the magnetic source assembly may include other types of drive mechanisms for moving the structures of the assembly with respect to one another such as, e.g., chain drives, belt drives, or cylinders.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An ion source system for an ion implantation system, the ion source system comprising:
    an arc chamber; and
    a source magnet assembly including:
        at least two magnetic poles that are positionable with respect to the arc chamber to provide a plurality of operational magnetic field positions with respect to the arc chamber;
        a first structure, the magnetic poles being coupled to the first structure; and
        a second structure slidably coupled to the first structure, the second structure coupled to the arc chamber, wherein movement of the first structure with respect to the second structure provides movement of the magnetic poles with respect to the arc chamber.

2. The ion source system of claim 1 wherein the first structure includes a first plate and the second structure includes a second plate, the first plate located above the second plate.

3. The ion source system of claim 1 further comprising:
    at least one sliding bearing, the first structure being coupled to the second structure via the at least one sliding bearing.

4. The ion source system of claim 1 further comprising:
    a first motor fixably coupled to the second sliding structure,
    a first threaded bracket fixably coupled to the first sliding structure;
    a first threaded drive in contact with the first threaded bracket, a rotation of the motor rotates the first threaded drive to provide a force on the first threaded bracket to move the first sliding structure with respect to the second sliding structure.

5. An ion source system for an ion implantation system, the ion source system comprising:
    an arc chamber;
    a source magnet assembly including at least two magnetic poles that are positionable with respect to the arc chamber to provide a plurality of operational magnetic field positions with respect to the arc chamber;
    a first sliding structure, the magnetic poles being fixably coupled to the first sliding structure;
    a second sliding structure, the first sliding structure being slidable with respect to the second sliding structure in a first direction; and
    a third structure, the arc chamber being fixably coupled to the third structure, the second sliding structure being slidable with respect to the third structure in a second direction, the first direction having at least a component of movement that is perpendicular to the second direction.

6. The ion source system of claim 5 further comprising:

a first motor fixably coupled to the second sliding structure;

a first threaded bracket fixably coupled to the first sliding structure;

a first threaded drive in contact with the first threaded bracket, a rotation of the first motor rotates the first threaded drive to provide a force on the first threaded bracket to move the first sliding structure with respect to the second sliding structure;

a second motor fixably coupled to the third sliding structure, a second threaded bracket fixably coupled to the second sliding structure;

a second threaded drive in contact with the second threaded bracket, a rotation of the motor rotates the second threaded drive to provide a force on the second threaded bracket to move the second sliding structure with respect to the third structure.

\* \* \* \* \*